United States Patent [19]  [11] 3,944,922
Chambers et al.  [45] Mar. 16, 1976

[54] RESISTIVITY MEASURING HEADS

[75] Inventors: Roger Nicolas Crovo Chambers; Peter William Amis, both of Newhaven, England

[73] Assignee: The Parc-Amber Company Limited, England

[22] Filed: Oct. 1, 1974

[21] Appl. No.: 511,060

[30] Foreign Application Priority Data
Oct. 15, 1973 United Kingdom............ 48024/73

[52] U.S. Cl................. 324/158 P; 324/64; 324/72.5
[51] Int. Cl.² G01R 1/06; G01R 31/02; G01R 27/14
[58] Field of Search....... 324/158 P, 158 F, 64, 72.5

[56] References Cited
OTHER PUBLICATIONS
Renz, U.; "Multipoint Test Probe . . . "; IBM Tech. Dis. Bull.; Vol. 17; No. 2; July 1974.

Primary Examiner—R. V. Rolinec
Assistant Examiner—Ernest F. Karlson
Attorney, Agent, or Firm—Bacon & Thomas

[57] ABSTRACT

A resistivity measuring head comprising a body portion and a replaceable nose portion. The body portion contains a plurality of spring-loaded pins located for axial movement in aligned plain openings in a pair of spaced guide plates, and the nose portion contains a number of probes, one for each pin, each precisely mounted in a pair of precisely aligned jewel bearings. The pins bear against one end of the probes for applying an axial working force thereto. Electrical connections are made to the probes either through the intermediacy of the pins or through a plug and socket arrangement wherein the probes are connected to plug pins carried by the nose piece and adapted for engagement with sockets in the body portion.

7 Claims, 7 Drawing Figures

RESISTIVITY MEASURING HEADS

This invention relates to resistivity measuring heads for use in the measurement of the resistivity of materials such as, for example, are used in the manufacture of semiconductor and thin film devices.

In the manufacture of semiconductor devices it is generally necessary, before any necessary processing of a semiconductor material can be effected, to determine by measurement the resistivity of the material. Such resistivity measurement is generally effected by lowering onto the surface of the material a resistivity measuring head which contains a plurality of probes which are spring-biassed to make electrical contact with the material. The probes are electrically insulated from one another and are spaced by predetermined distances so that in use of the resistivity measuring head an electric current can be passed via the probes through the material to determine the resistance which the material presents between the probes, the resistivity of the material then being calculated by known methods. In a typical resistivity measuring head there may be for example three probes which are arranged in a line or at the apices of a triangle, or there may be four probes which are arranged in a line or at the corners of a square. Even more probes may be provided for special purposes.

It is a primary requirement of such resistivity measuring heads that the positional accuracy of the probes be determined to a high degree and be maintained for a reasonable period throughout the use of the head when it is subjected to wear. For the purpose of illustration, the probe tip spacings are commonly of the order of 0.025 inches to 0.062 inches and, for accurate measurement, spacing tolerances much in excess of ±0.00025 inches are not acceptable. In order to obtain tolerances of this order, horological techniques have been applied to the problems of supporting the probes, previous attempts to support the probes in simple plastics guides having proven totally unsatisfactory.

In one well known resistivity measuring head, the probe needles are relatively long (e.g., 1 inch) and are each supported adjacent their ends in two spaced guide plates through which they pass and relative to which they have a limited range of axial movement. For obtaining and maintaining the desired degree of positional accuracy of the probe tips, the guide plate at the front or lower end of the probe needles (i.e., the end which, in use, will contact the specimen) is precisely formed with jig-bored holes each accommodating a jewel bearing which supports a probe needle. The rear or upper guide plate, i.e., the guide plate at the other end of the probe needles, is a jig-bored plastics (e.g., PTFE) plate. It will be appreciated that the relative substantial length of the needles enables a less precise construction of the rear guide plate to be tolerated.

During use of resistivity measuring heads, the pointed ends of the probes become worn and eventually it becomes necessary either for the complete measuring head to be replaced, or for it to be reconditioned by the fitting of new probes and guide plates, such reconditioning generally necessitating the return of the measuring head to the manufacturer or to his service agent.

The present invention proposes the provision of a resistivity measuring head having a disposable nose portion which contains relatively short (e.g., 0.2 ins) straight probe tips mounted in precisely formed and located holes by means of jewel bearings, each probe tip being supported by means of a pair of spaced jewel bearings and being capable of a limited amount of axial movement, the body of the head (i.e., the part of the head to which, in use, the nose portion is attached) having, for each probe tip, a relatively long (e.g., 1.0 ins) spring-loaded pin mounted for limited axial movement, for example in a pair of spaced guides, and arranged so as, in use of the head with the nose portion attached, to bear at one end upon one end of a respective probe tip so as to apply thereto the requisite operational spring bias.

This invention thus resides in the realisation that an improved resistivity measuring head can be provided by dividing each probe into two separate parts: a first relatively short part forming a probe tip which is retained in a pair of accurately positioned and aligned jewel bearings, and a second part forming a pin which serves only to apply spring bias to the probe tip and to make electrical contact therwith and is not involved in the positional guidance of the probe tip and therefore can be less accurately positioned and can be mounted in simple bearings (e.g., holes in guide plates) which need not be jewelled and can therefore be relatively inexpensive. Such an arrangement permits the use of a nose portion for the resistivity measuring head which contains all of the probe tips and jewel bearings therefor and which, when the probe tips are worn, can be discarded and simply replaced with a new nose portion from stock.

The present invention extends not only to the provision of an improved resistivity measuring head as above defined, but also extends to replacement nose portions for use therewith.

The present invention obtains a significant advantage, over and above the significant advantage of enabling ready replacement of the probe tips, by virtue of the fact that the pins do not take any part in the precise location of the probe tips, but merely serve to apply spring pressure thereto and to make electrical contact therewith, and therefore do not themselves require to be positioned with any special orientation so long as they serve their function. As has been mentioned previously herein, it is common to use different probe spacings and different probe orientations, e.g., collinear, triangular or rectangular; for a set number of probes, it is possible, by virtue of this invention, to use nose portions with different probe spacings and orientations in conjunction with the same head body portion merely by arranging the orientations of the pins to be adjustable to suit different probe configurations. One way of arranging this is to mount the pins in spaced guide plates, the pins passing through respective holes in each of the plates and their orientation being determined by the positions of the holes in the front plate (i.e., the plate nearer to the nose portion, in use of the head) relative to those in the back plate which are formed to permit pivotal movement of the pins thereabout; merely by replacing the front plate, the pin configuration can be changed to adapt to a different probe configuration. Another advantage is achieved in that, despite the fact that the probe spacings are very small, the back ends of the pins can be spaced apart a more reasonable distance having regard to the need to spring bias the pins and apply electrical conductors thereto.

The invention will best be understood from the following description with reference to the accompanying drawings, in which.

Throughout the drawings the same reference numerals are used to denote like parts.

Figure 1:
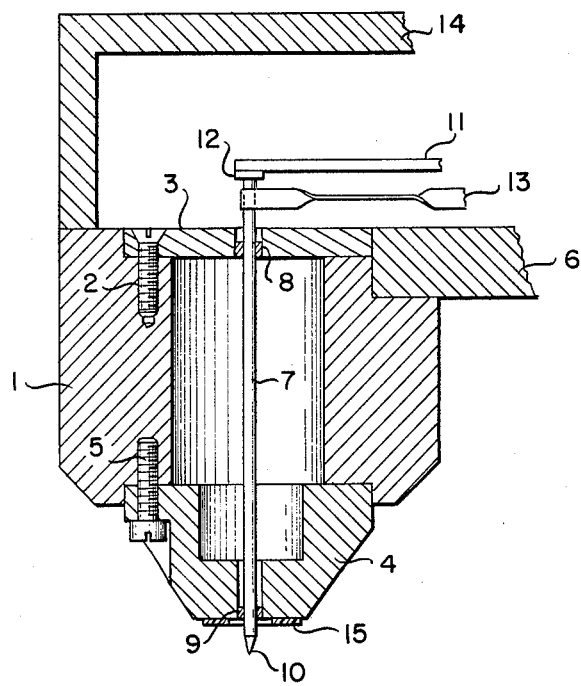
FIG. 1 shows in section part of a known type of resistivity measuring head.

Referring to FIG. 1, there is shown therein part of a known type of resistivity measuring head which comprises a housing having a generally cylindrical hollow body 1, to which is screwed by means of screws such as the screw 2 an upper guide plate 3, and a nose portion 4 which is also screwed to the body 1 by means of screws such as the screw 5. The housing is supported by a member 6 to which the body 1 is secured by means, e.g., screws, not shown.

A plurality of probes, only one of which referenced 7 is shown, extend through the hollow body 1 and each probe is supported for reciprocal movement along its axis by a bearing 8 provided in the upper guide plate 3 and by a jewel bearing 9 provided in the nose portion 4, which thus serves as a lower guide plate for the probes. Each probe has a pointed lower end 10 which protrudes from the nose portion 4 for making contact with the surface of a material the resistivity of which is to be measured, and the upper end of each probe extends above the upper guide plate 3.

Each probe is biassed downwardly by a respective spring 11 having an insulating pad 12 which engages the upper end of the probe, and an electrical connection is made to the upper end of each probe via a respective phosphor bronze ligament 13 soldered to the probe. A cover 14 is provided over the upper ends of the probes, the springs 11 and the ligaments 13, and the lowermost surface of the nose portion 4 has an insulating pad 15 to prevent the nose portion 4 from making electrical contact in operation with the material the resistivity of which is being measured.

Figure 2:
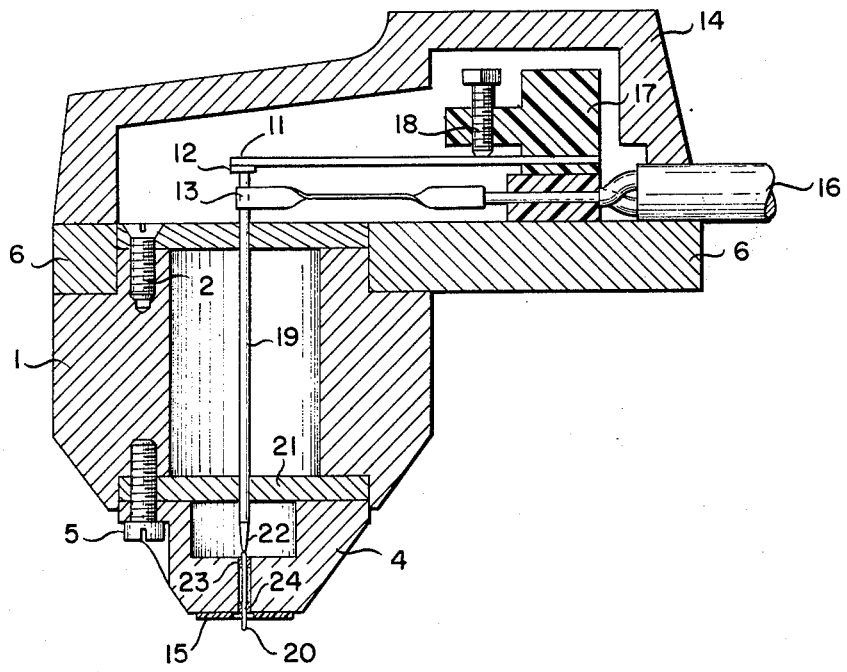
FIG. 2 shows in section by way of example only a resistivity measuring head according to a preferred embodiment of the present invention.

Referring now to FIG. 2, there is shown therein a resistivity measuring head which is in accordance with a preferred embodiment of this invention. As in the known measuring head described with reference to FIG. 1, the measuring head shown in FIG. 2 comprises a housing supported by a number 6 and having a body 1 and a nose portion 4. The measuring head shown in FIG. 2 also has a cover 14, springs 11 with insulating pads (e.g., of PTFE) 12, and connecting ligaments 13 as for the measuring head shown in FIG. 1. As can be seen in FIG. 2, electrical connections are made to the ligaments 13 and hence to the probes by a lead 16 and a terminal block 17. The terminal block 17 also serves as a mounting for the springs 11, the bias of each of which can be adjusted by a respective screw 18 provided on the terminal block 17.

In the resistivity measuring head shown in FIG. 2 each of the plurality of probes which extend through the body 1 is constituted by two parts, a pin 19 and a probe tip 20. By way of example the pin 19 could be of gold plated steel and the probe tip 20 could be of tungsten carbide. As can be seen in FIG. 2, each pin 19 is guided for reciprocal movement along its length by an upper guide plate 3 which is screwed to the body 1 by means of screws such as the screw 2 and by a lower guide plate 21 which is also screwed to the body 1 by means of screws which are not shown. Both of the guide plates 3 and 21 may, for example, be of glass loaded PTFE. As can be seen in FIG. 2, jewel bearings are not provided in either of the guide plates 3 and 21. The upper end of each pin 19 extends above the upper guide plate 3 and is engaged by the insulating pad 12 of the respective spring 11 and has soldered thereto the respective ligament 13. The lower end of each pin 19 terminates in a tapered portion 22 below the lower guide plate 21.

All of the plurality of probe tips are supported for reciprocal movement along their lengths in the nose portion 4 by pairs of jewel bearings, e.g., of ruby, 23 and 24 provided in the nose portion 4. As will be more fully described below, each probe tip 20 is provided with a collar (not shown in FIG. 2) which prevents the probe tip from being removed from or falling out of its supporting bearings. The nose portion 4 is screwed, through holes provided in the lower guide plate 21, to the body 1 by means of screws such as the screw 5. As in the arrangement of FIG. 1, the nose portion 4 carries an insulating pad 15, e.g., of PTFE, on its lowermost surface.

It will be appreciated from the above description and from FIG. 2 that each of the probe tips 20 is abutted and engaged at its upper end by the lower tapered end portion 22 of a respective one of the pins 19. To this end, the holes in the lower guide plate 21 are arranged to position the lower ends of the pins 19 directly above the upper ends of the probe tips 20. Although the positioning of the lower ends of the pins 19 may be achieved with relative inaccuracy, since the pins 19 are not carried in precision bearings in the guide plates 3 and 21 and the pins 19 may not be perfectly straight, this does not impair the accuracy of measurements made with the measuring head provided that the positions of the probe tips 20 are accurate, the lower ends of the pins 19 are substantially above the respective probe tips 20, and a good electrical contact is achieved between the pins 19 and the respective probe tips 20.

It will also be appreciated that when for example the probe tips 20 become worn, they can readily be replaced by a user of the resistivity measuring head simply by removing the screws 5, removing the nose portion 4, and screwing a replacement nose portion 4 into place. To facilitate such replacement and also for simplifying assembly or servicing of the resistivity measuring head the nose portion 4 and the guide plates 3 and 21 may be provided with locating projections or recesses so that they can be oriented in only one position.

A disadvantage of the known type of resistivity measuring head as shown in FIG. 1 is that when the probes are arranged, for example, at the corners of a square it becomes difficult to provide a suitable arrangement of the springs 11 and ligaments 13 because of overlapping of these springs and ligaments. This disadvantage is obviated in the resistivity measuring head shown in FIG. 2, because in the latter measuring head the upper ends of the pins 19 can be maintained substantially collinear regardless of the particular orientation of the probe tips 20. This could be achieved for example by arranging the holes in the upper guide plate 3 through which the pins 19 extend to be collinear and making them slightly oversize to accommodate a degree of misalignment of the pins 19, this misalignment being brought about by positioning the holes in the lower guide plate 21 through which the pins extend so that the lower ends of the pins 29 are substantially above the upper ends of the probe tips 20.

Purely by way of practical example, it is pointed out that the resistivity measuring head shown in FIG. 2 could have four pins 19 and four probe tips 20. In such a case the holes in the upper guide plate 3 through which the pins 19 extend could be collinear and spaced apart by distances of 0.040 inches. With suitable positioning of the holes in the lower guide plate 21, the probe tips 20 could be collinear and spaced apart by distances of 0.025 inches, 0.040 inches, or 0.062 inches, or they could be arranged at the corners of a square having sides 0.025 inches long. With such arrangements, the pairs of bearings 23 and 24 could be of ruby, each pair of bearings being a slight interference fit in a respective hole, in the nose portion 4, of 0.6 mm. diameter and 4 mm. long, each bearing having an internal diameter of 0.3 mm., this being the diameter of each probe tip 20.

Referring now to FIGS. 3 to 6, there are shown therein to an enlarged scale alternative forms which the replaceable nose portion 4 of the resistivity measuring head of FIG. 2 may take, and these figures also better illustrate the arrangement of each probe tip 20. In these figures, the mounting holes in the nose portion 4 through which the screws such as the screw 5 shown in FIG. 2 extend are not shown.

Figure 3:
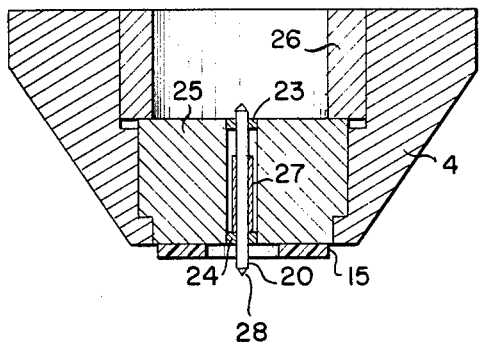
FIGS. 3 to 6 show in section and to an enlarged scale alternative forms which the replaceable nose portion of the resistivity measuring head of FIG. 2 may take.

FIG. 3 shows an arrangement in which the replaceable nose portion 4 has a removable central portion 25 in which the jewel bearings 23 and 24 are provided. The central portion 25 is held in position when the nose portion 4 is attached to the body 1 of the resistivity measuring head by a sleeve or ring 26. FIG. 3 also shows the collar 27 which is provided on each probe tip 20 to prevent the probe tip from being removed from or falling out of its supporting bearings, and it shows that each tip 20 terminates at its lower end in a pointed portion 28, which is radiussed at its tip.

In the nose portion 4 shown in each of FIGS. 2 and 3 each hole in which a pair of jewel bearings 23 and 24 are accommodated may typically be about 0.6 mm. in diameter and 4 mm. long. Whilst it is quite practical to drill holes of such diameters, the length of the holes is such as to make subsequent boring difficult. This difficulty is overcome by the arrangements of the nose portion 4 shown in FIGS. 4 to 6.

Figure 4:
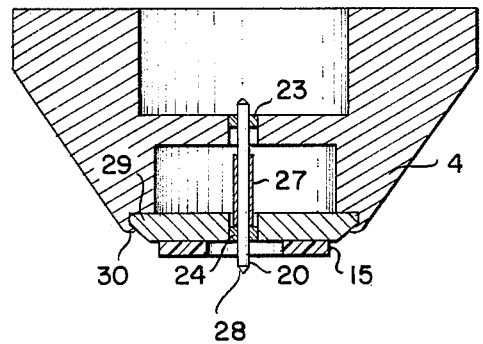
Figure 5:
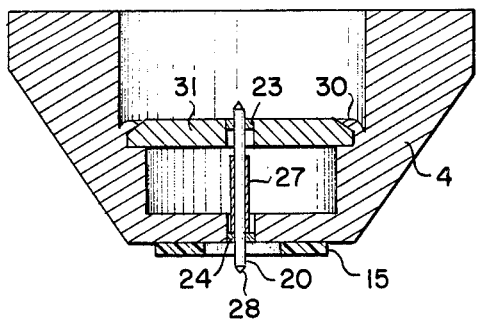

The nose portion 4 shown in FIG. 4 is similar to that shown in FIG. 2 with the exception that the lower central part of the nose portion 4 is recessed and a plate 29 is accommodated at the lower face of the recess, being retained there by a spun or swaged edge 30 on the nose portion 4. The jewel bearings 23 are accommodated in relatively short holes in the nose portion 4 above the recess and the jewel bearings 24 are now accommodated in the plate 29. The arrangement shown in FIG. 5 is similar to that shown in FIG. 4 except that the jewel bearings 24 are accommodated in the nose portion 4 and the jewel bearings 23 are accommodated in a plate 31, which like the plate 29 is retained by a spun or swaged edge 30. In the arrangement shown in FIG. 6, the nose portion 4 is completely hollow and both of the plates 29 and 31 are provided to accommodate the jewel bearings 24 and 23 respectively.

Figure 6:
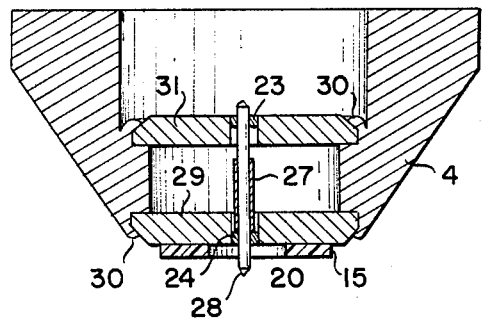

It will be appreciated that in the arrangements shown in FIGS. 4 to 6 any slight inaccuracy in the position of the plates 29 and 31 does not impair the accuracy of measurements, provided that the positions of the jewel bearings 23 relative to each other correspond exactly to the positions of the jewel bearings 24 relative to each other, so that the probe tips 20 are all parallel to one another.

Figure 7:
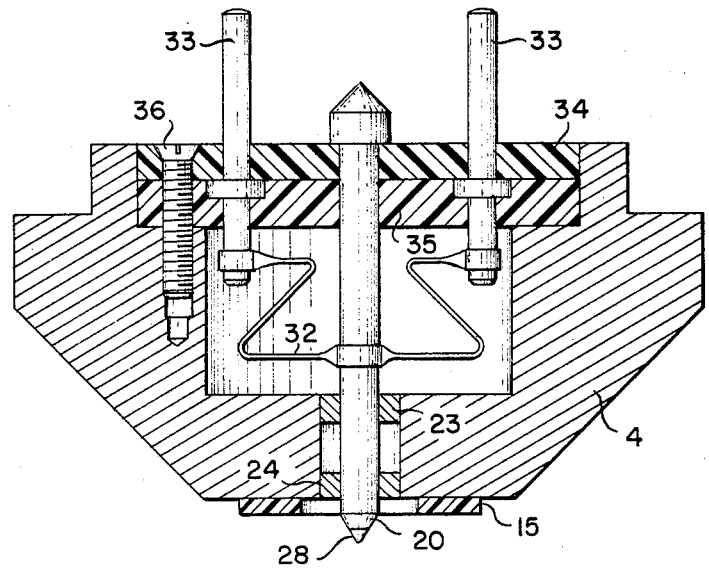
FIG. 7 shows yet another form of the replaceable nose portion with a different arrangement for making electrical connection to the probes.

FIG. 7 shows yet another replaceable nose portion 4 but this time with a different arrangement for making electrical connection with the probes 20 which does not rely upon the contact between the pins 19 and the probes 20. Each probe 20 is, as in the previously described embodiments, supported in a pair of jewel bearings 23 and 24 and, additionally locates at its upper end in an opening formed in an electrically non-conductive guide plate 34. In conjunction with an electrically non-conductive rest plate 35, the guide plate 34 serves to hold captive a number of goldplated plug pins 33, one for each probe 20, which are electrically connected to the respective probes 20 by flexible ligaments 32. The plates 34 and 35 may be secured to the nose piece 4 by screws 36 for example, it being appreciated that the plates, whilst they do provide a degree of support for the probes 20, do not figure in the accurate positioning of the probes. In the complete head, the plug pins 33 will mate with matching sockets provided in the body 1 of the head and connected with the input/output lead 16 by any suitable electrical connection.

It will thus be seen that in all of the forms of the replaceable nose portion 4 shown in FIGS. 2 to 7 the positions of the probe tips 20 can be very precisely controlled, and slight inaccuracies in the positions of other elements of the resistivity measuring head, e.g. in the positions of the lower ends of the pins 19, do not impair the accuracy with which resistivity measurements can be performed. The resistivity measuring head in accordance with the invention as described above can thus have an overall greater accuracy than can the known types of resistivity measuring head.

We claim:

1. A resistivity measuring head comprising a body portion and a nose portion attachable to and detachable from the body portion, the nose portion having mounted therein a plurality of relatively-short straight probe tips supported parallel to one another for limited axial movement each by means of a pair of spaced jewel bearings fitted into a bore formed in the nose portion, one end of each probe tip being arranged to project from the nose portion for contacting a specimen the resistivity of which is to be measured, and the body portion having mounted therein, for each probe tip, a relatively long spring loaded pin capable of limited axial movement in the general direction of the axial extent of the probe tips and arranged so that, with the nose portion attached to the body portion, one end of each pin bears upon one end of the respective probe tip so as to apply thereto a spring bias.

2. A resistivity measuring head as claimed in claim 1 wherein the pins are so mounted in the body portion as to enable the body portion to be used with different nose portions wherein the probes are differently located with respect to one another.

3. A resistivity measuring head as claimed in claim 2 wherein the pins are mounted in corresponding apertures formed in a pair of spaced guide plates, and the apertures in the guide plate furthermost from the ends of the pins which bear upon the probe tips are formed to permit a degree of pivotal movement of the pins thereabout whereby to permit the pins to adopt different orientations determined by the relative locations of the apertures in the two plates.

4. A resistivity measuring head as claimed in claim 1 wherein said probe tips are of the order of 0.2 inches in length as compared with said pins being of the order of 1.0 inch in length.

5. A resistivity measuring head as claimed in claim 1 wherein said jewel bearings are ruby bearings, the probe tips are formed of tungsten carbide, and the pins are formed of gold-plated steel.

6. A resistivity measuring head as claimed in claim 1 wherein means are provided in said nose portion for cooperation with complementarily shaped means in the body portion for making electrical connection in a plug and socket fashion with said probe tips.

7. A nose portion as defined in claim 1 for use with a resistivity measuring head as claimed in claim 1.

* * * * *